United States Patent
Uchiyama

(10) Patent No.: US 8,828,306 B2
(45) Date of Patent: Sep. 9, 2014

(54) WORKING OBJECT CUTTING METHOD

(75) Inventor: Naoki Uchiyama, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 714 days.

(21) Appl. No.: 12/744,727

(22) PCT Filed: Nov. 18, 2008

(86) PCT No.: PCT/JP2008/070950
§ 371 (c)(1),
(2), (4) Date: Aug. 4, 2010

(87) PCT Pub. No.: WO2009/069510
PCT Pub. Date: Jun. 4, 2009

(65) Prior Publication Data
US 2010/0301521 A1 Dec. 2, 2010

(30) Foreign Application Priority Data
Nov. 30, 2007 (JP) ................. P2007-311645

(51) Int. Cl.
| B29C 35/08 | (2006.01) |
| H01L 21/78 | (2006.01) |
| B23K 26/08 | (2014.01) |
| B23K 26/00 | (2014.01) |
| B23K 26/40 | (2014.01) |

(52) U.S. Cl.
CPC ............ B23K 26/0057 (2013.01); H01L 21/78 (2013.01); B23K 26/0823 (2013.01); *B23K 2201/40* (2013.01); B23K 26/4075 (2013.01)
USPC ........... 264/482; 264/400; 264/430; 264/157; 264/297.1; 264/297.8; 264/297.9; 264/332; 438/462; 438/463

(58) Field of Classification Search
USPC .............. 264/400, 430, 482, 157, 163, 297.1, 264/297.8, 297.9, 332; 438/463, 462
See application file for complete search history.

(56) References Cited

U.S. PATENT DOCUMENTS

| 4,546,231 A | 10/1985 | Gresser et al. | |
| 6,562,698 B2 * | 5/2003 | Manor | ........................ 438/460 |

(Continued)

FOREIGN PATENT DOCUMENTS

| CN | 1160228 A | 9/1997 |
| CN | 1703770 | 11/2005 |

(Continued)

OTHER PUBLICATIONS

JPO English machine translation of JP 2007-258236, retrieved Sep. 20, 2012.*

(Continued)

*Primary Examiner* — Timothy Kennedy
(74) *Attorney, Agent, or Firm* — Drinker Biddle & Reath LLP

(57) ABSTRACT

A working object cutting method capable of cutting a working object precisely is provided. The working object cutting method comprises irradiating a working object 1 with a laser beam while locating a converging point at the working object, so as to form a reformed region in the working object 1 along a reformed-region forming line 15 set at a predetermined distance inside from an outer edge E of the working object 1 along the outer edge, forming a cutting reformed region in the working object 1 along a cutting-scheduled line 5, and cutting the working object 1 along the cutting-scheduled line 5 from a cutting reformed region acting as a start point. Thus forming the working object 1 with the reformed region along the reformed-region forming line 15 set at a predetermined distance inside from the outer edge E of the working object 1 allows the formed reformed region or fissures extending therefrom to inhibit fissures generated in an outer edge portion 25 of the working object 1 from extending to the inside even if a cutting stress is applied to the working object 1 when cutting the working object 1.

11 Claims, 19 Drawing Sheets

(56) References Cited

U.S. PATENT DOCUMENTS

| | | | |
|---|---|---|---|
| 6,992,026 B2 | 1/2006 | Fukuyo et al. | |
| 7,396,742 B2 | 7/2008 | Fukuyo et al. | |
| 7,489,454 B2 | 2/2009 | Fukuyo et al. | |
| 7,547,613 B2 | 6/2009 | Fukuyo et al. | |
| 7,566,635 B2 | 7/2009 | Fujii et al. | |
| 7,592,237 B2 | 9/2009 | Sakamoto et al. | |
| 7,592,238 B2 | 9/2009 | Fukuyo et al. | |
| 7,605,344 B2 | 10/2009 | Fukumitsu | |
| 7,608,214 B2 | 10/2009 | Kuno et al. | |
| 7,615,721 B2 | 11/2009 | Fukuyo et al. | |
| 7,626,137 B2 | 12/2009 | Fukuyo et al. | |
| 7,709,767 B2 | 5/2010 | Sakamoto | |
| 7,718,510 B2 | 5/2010 | Sakamoto et al. | |
| 7,719,017 B2 | 5/2010 | Tanaka | |
| 7,732,730 B2 | 6/2010 | Fukuyo et al. | |
| 7,749,867 B2 | 7/2010 | Fukuyo et al. | |
| 7,754,583 B2 | 7/2010 | Sakamoto | |
| 7,825,350 B2 | 11/2010 | Fukuyo et al. | |
| 7,897,487 B2 | 3/2011 | Sugiura et al. | |
| 7,902,636 B2 | 3/2011 | Sugiura et al. | |
| 7,939,430 B2 | 5/2011 | Sakamoto et al. | |
| 7,947,574 B2 | 5/2011 | Sakamoto et al. | |
| 7,981,770 B2 * | 7/2011 | Kaneko | 438/463 |
| 2002/0125232 A1 | 9/2002 | Choo et al. | |
| 2005/0189330 A1 * | 9/2005 | Fukuyo et al. | 219/121.72 |
| 2005/0202596 A1 | 9/2005 | Fukuyo et al. | |
| 2005/0272223 A1 | 12/2005 | Fujii et al. | |
| 2006/0144828 A1 | 7/2006 | Fukumitsu et al. | |
| 2006/0148212 A1 | 7/2006 | Fukuyo et al. | |
| 2006/0255024 A1 | 11/2006 | Fukuyo et al. | |
| 2007/0085099 A1 | 4/2007 | Fukumitsu et al. | |
| 2007/0125757 A1 | 6/2007 | Fukuyo et al. | |
| 2007/0158314 A1 | 7/2007 | Fukumitsu et al. | |
| 2007/0252154 A1 | 11/2007 | Uchiyama et al. | |
| 2008/0035611 A1 | 2/2008 | Kuno et al. | |
| 2008/0037003 A1 | 2/2008 | Atsumi et al. | |
| 2008/0090382 A1 | 4/2008 | Fujii et al. | |
| 2008/0218735 A1 | 9/2008 | Atsumi et al. | |
| 2008/0251506 A1 | 10/2008 | Atsumi et al. | |
| 2009/0008373 A1 | 1/2009 | Muramatsu et al. | |
| 2009/0032509 A1 | 2/2009 | Kuno et al. | |
| 2009/0098713 A1 | 4/2009 | Sakamoto | |
| 2009/0107967 A1 | 4/2009 | Sakamoto et al. | |
| 2009/0117712 A1 | 5/2009 | Sakamoto et al. | |
| 2009/0166342 A1 | 7/2009 | Kuno et al. | |
| 2009/0166808 A1 | 7/2009 | Sakamoto et al. | |
| 2009/0250446 A1 | 10/2009 | Sakamoto | |
| 2009/0261083 A1 | 10/2009 | Osajima et al. | |
| 2009/0302428 A1 | 12/2009 | Sakamoto et al. | |
| 2010/0006548 A1 | 1/2010 | Atsumi et al. | |
| 2010/0009547 A1 | 1/2010 | Sakamoto | |
| 2010/0012632 A1 | 1/2010 | Sakamoto | |
| 2010/0012633 A1 | 1/2010 | Atsumi et al. | |
| 2010/0015783 A1 | 1/2010 | Fukuyo et al. | |
| 2010/0025386 A1 | 2/2010 | Kuno et al. | |
| 2010/0032418 A1 | 2/2010 | Kuno et al. | |
| 2010/0055876 A1 | 3/2010 | Fukuyo et al. | |
| 2010/0151202 A1 | 6/2010 | Fukumitsu | |
| 2010/0176100 A1 | 7/2010 | Fukuyo et al. | |
| 2010/0184271 A1 | 7/2010 | Sugiura et al. | |
| 2010/0200550 A1 | 8/2010 | Kumagai | |
| 2010/0203678 A1 | 8/2010 | Fukumitsu et al. | |
| 2010/0203707 A1 | 8/2010 | Fujii et al. | |
| 2010/0227453 A1 | 9/2010 | Sakamoto | |
| 2010/0240159 A1 | 9/2010 | Kumagai et al. | |
| 2010/0258539 A1 | 10/2010 | Sakamoto | |
| 2010/0311313 A1 | 12/2010 | Uchiyama | |
| 2010/0327416 A1 | 12/2010 | Fukumitsu | |
| 2011/0000897 A1 | 1/2011 | Nakano et al. | |
| 2011/0001220 A1 | 1/2011 | Sugiura et al. | |
| 2011/0021004 A1 | 1/2011 | Fukuyo et al. | |
| 2011/0027971 A1 | 2/2011 | Fukuyo et al. | |
| 2011/0027972 A1 | 2/2011 | Fukuyo et al. | |
| 2011/0037149 A1 | 2/2011 | Fukuyo et al. | |
| 2011/0274128 A1 | 11/2011 | Fukumitsu et al. | |

FOREIGN PATENT DOCUMENTS

| | | | |
|---|---|---|---|
| CN | 101040369 | | 9/2007 |
| JP | 04099047 A | * | 3/1992 |
| JP | H8-066848 | | 3/1996 |
| JP | 2007-227768 | | 9/2007 |
| JP | 2007-227769 | | 9/2007 |
| JP | 2007-235069 | | 9/2007 |
| JP | 2007-258236 | | 10/2007 |
| TW | 200626274 | | 8/2006 |
| TW | I270431 | | 1/2007 |
| TW | 200732076 | | 9/2007 |
| WO | 03/076118 | | 9/2003 |

OTHER PUBLICATIONS

X. Liu et al., "Laser Ablation and Micromachining with Ultrashort Laser Pulses," IEEE Journal of Quantum Electronics, vol. 33, No. 10, Oct. 1997, pp. 1706-1716.
U.S. Appl. No. 13/206,181, filed Aug. 9, 2011.
U.S. Appl. No. 13/269,274, filed Oct. 7, 2011.
U.S. Appl. No. 13/235,936, filed Sep. 19, 2011.
U.S. Appl. No. 13/213,175, filed Aug. 19, 2011.
U.S. Appl. No. 13/233,662, filed Sep. 15, 2011.
U.S. Appl. No. 13/061,438, filed Apr. 26, 2011.
U.S. Appl. No. 13/107,056, filed May 13, 2011.
U.S. Appl. No. 13/151,877, filed Jun. 2, 2011.
U.S. Appl. No. 13/131,429, filed Jun. 28, 2011.
U.S. Appl. No. 13/143,636, filed Sep. 21, 2011.
U.S. Appl. No. 13/148,097, filed Aug. 26, 2011.
U.S. Appl. No. 13/262,995, filed Oct. 5, 2011.
U.S. Appl. No. 13/265,027, filed Oct. 18, 2011.
Ken-Ichi Hayashi, "Inner Glass Marking by Harmonics of Solid State Laser," Proceedings of 45$^{th}$ Laser Materials Processing Conference, Dec. 1998, pp. 23-28 [English Abstract].
Kiyotaka Miura et al., "Formation of Photo-induced Structures in Glasses with Femtosecond Laser," Proceedings of 42$^{nd}$ Laser Materials Conference, Nov. 1997, pp. 105-111 [English Abstract].
T Sano, "Evaluation of Processing Characteristics o f Silicon with Picosecond Pulse Laser," Preprints of the National Meeting of Japan Welding Society, Apr. 2000, No. 66, pp. 72-73 [English Translation].

* cited by examiner

Fig.10
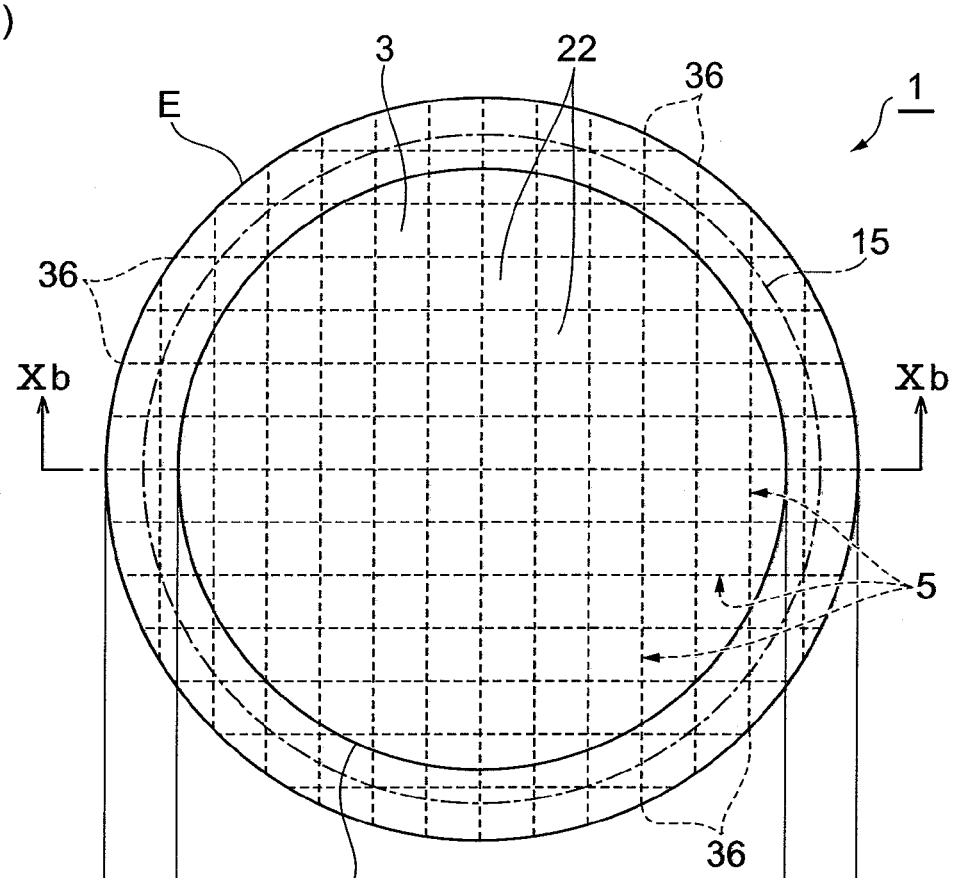
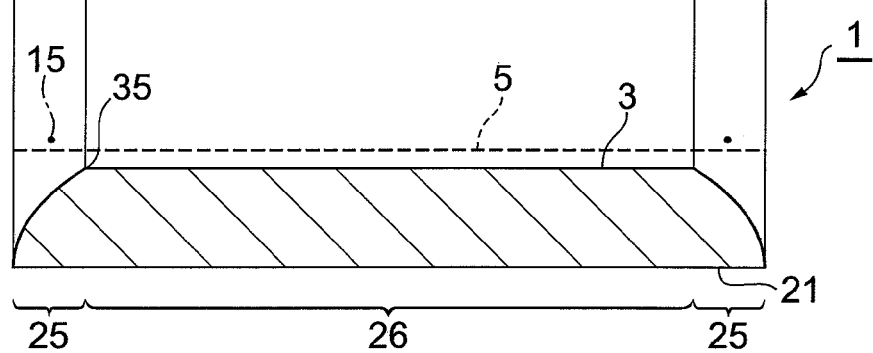

Fig.11
(a)
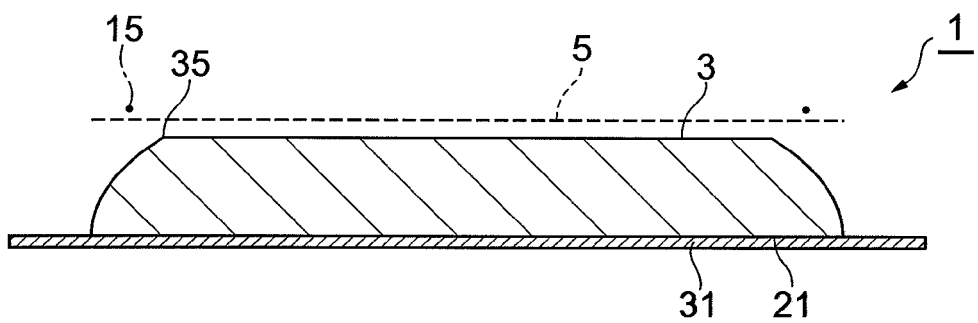
(b)
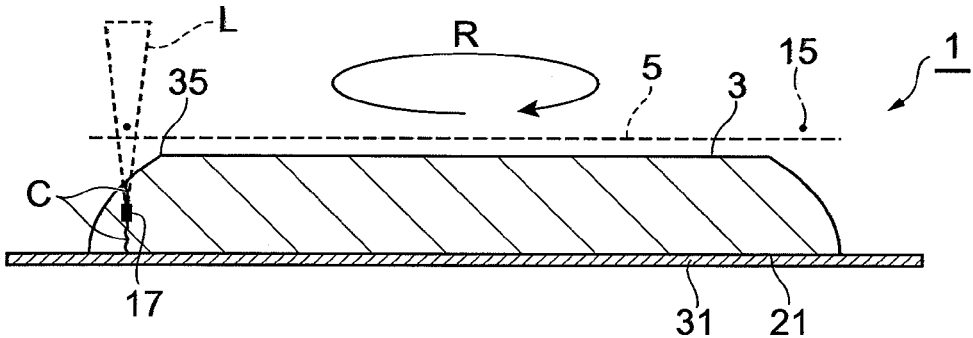
(c)
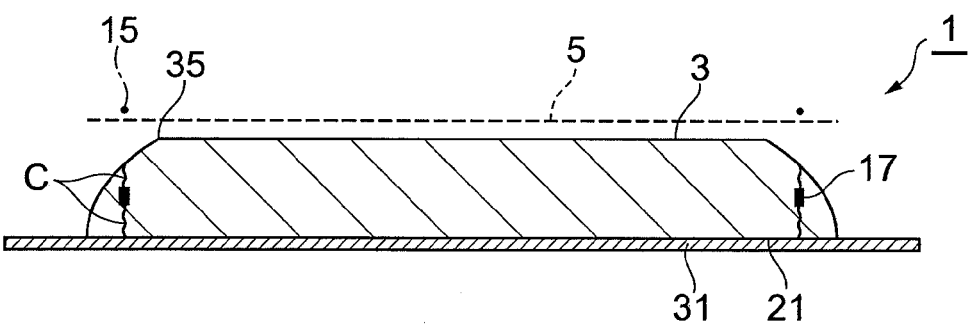

Fig.12
(a)
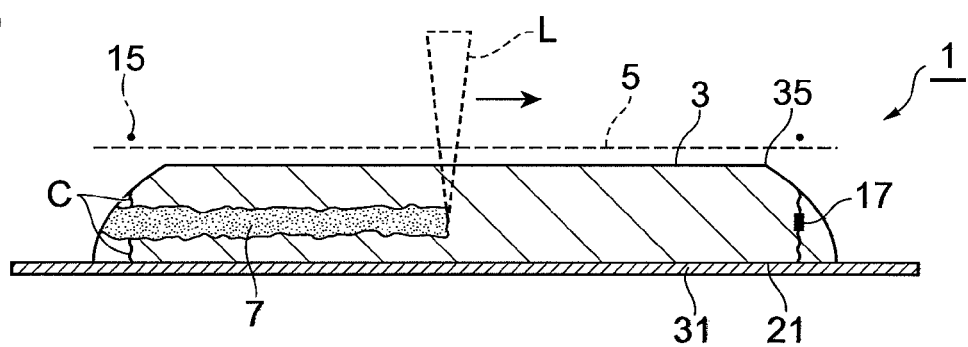
(b)
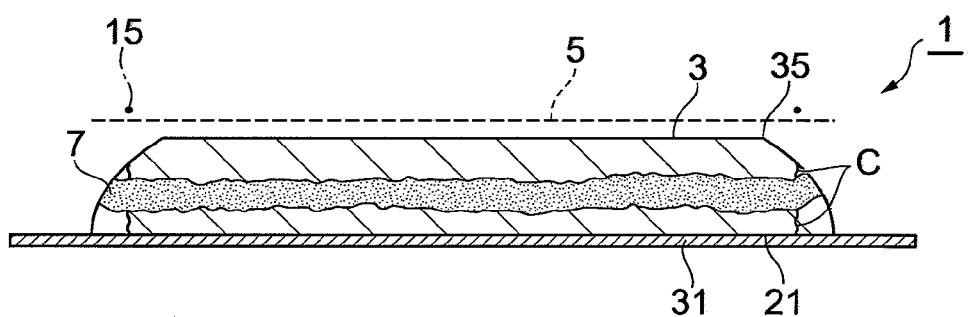
(c)
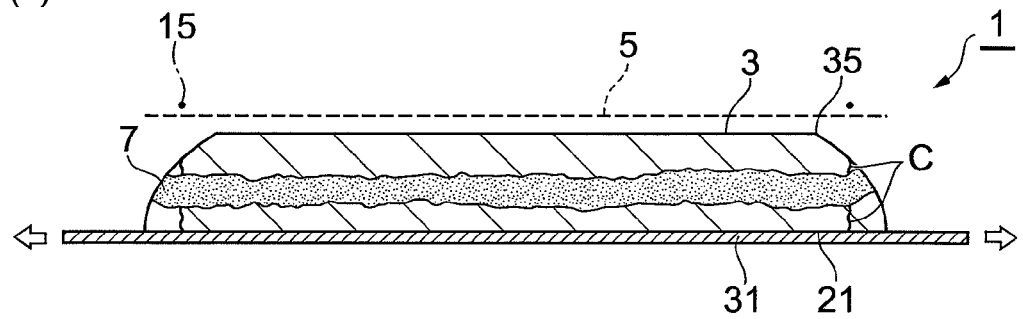

Fig.13
(a)
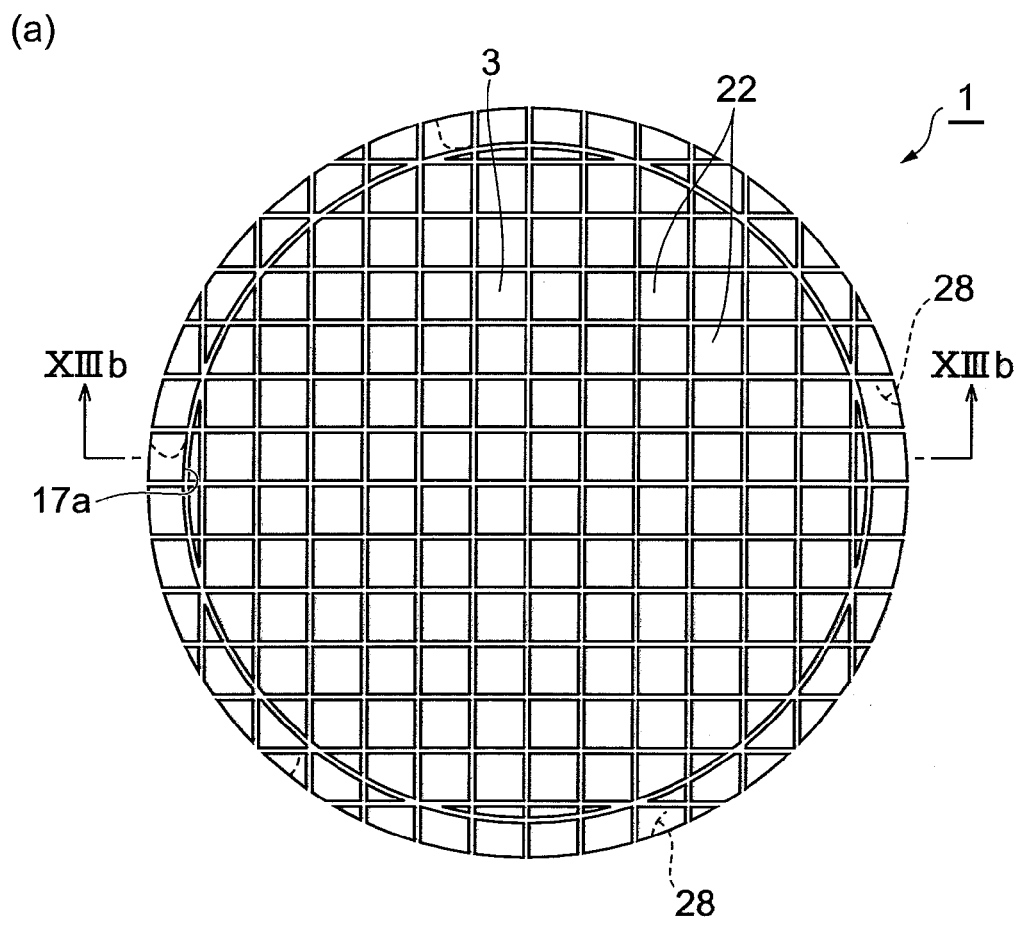
(b)
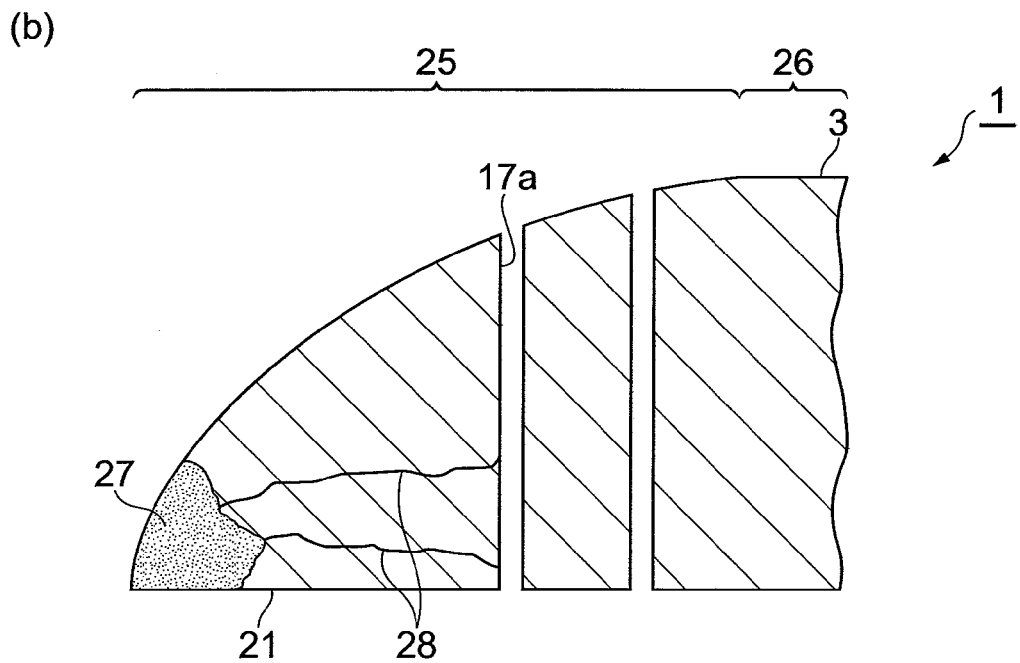

Fig.14
(a)
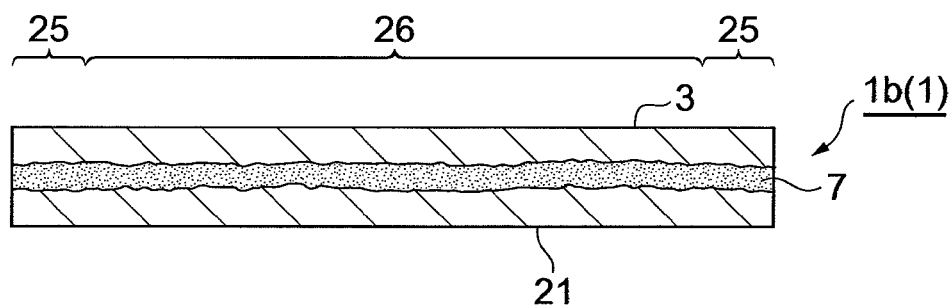
(b)
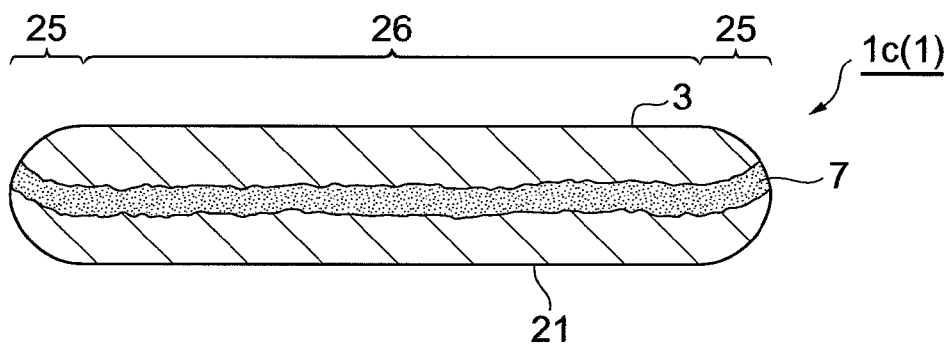

Fig.15
(a)
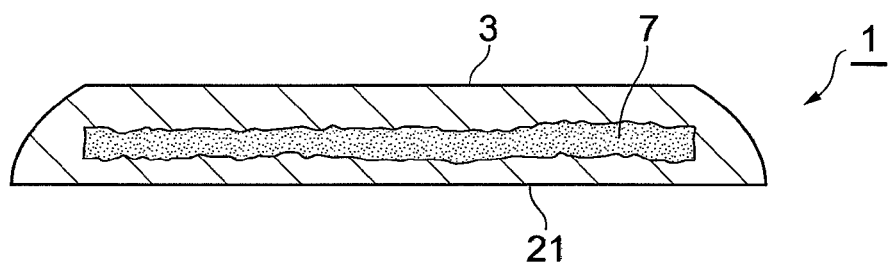
(b)
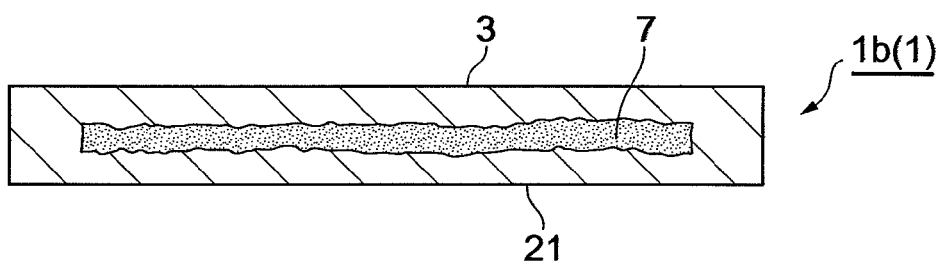
(c)
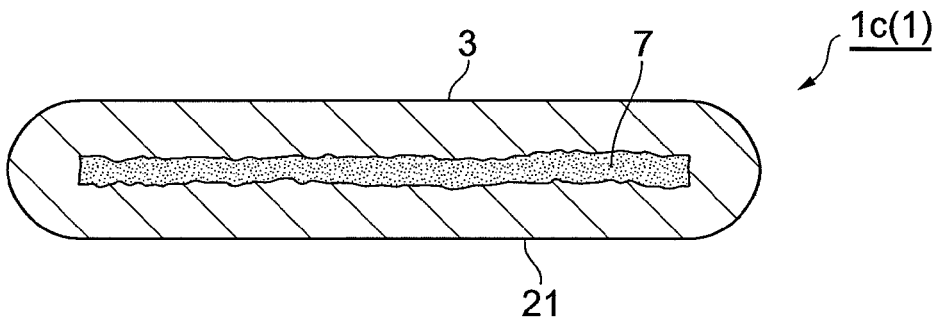

WORKING OBJECT CUTTING METHOD

TECHNICAL FIELD

The present invention relates to a working object cutting method for cutting a working object along a cutting-scheduled line.

BACKGROUND ART

Known as a conventional working object cutting method is one including the steps of forming a cutting start region in a working object along a cutting-scheduled line and cutting the working object along the cutting-scheduled line from the cutting start region acting as a start point (see, for example, Patent Literature 1).

Patent Literature 1: Japanese Patent Application Laid-Open No. 2007-235069

DISCLOSURE OF INVENTION

Technical Problem

However, working object cutting methods such as the one mentioned above have a problem that, when cutting the working object, fractures occurring in outer edge portions of the working object may extend to the inside under a stress applied for cutting (hereinafter referred to as "cutting stress"). When the working object is thin, chipping (breakage) is easier to occur in the outer edge portions of the working object, whereby the above-mentioned problem becomes remarkable.

It is therefore an object of the present invention to provide a working object cutting method which can cut a working object precisely.

Solution to Problem

For achieving the above-mentioned object, the working object cutting method in accordance with the present invention is a working object cutting method for cutting a planar working object along a cutting-scheduled line, the method comprising the steps of irradiating the working object with a laser beam while locating a converging point at the working object, so as to form a reformed region in the working object along a reformed-region forming line set at a predetermined distance inside from an outer edge of the working object along the outer edge; forming a cutting start region along the cutting-scheduled line; and cutting the working object along the cutting-scheduled line from the cutting start region acting as a start point.

In this working object cutting method, a reformed region is formed in the working object along a reformed-region forming line set at a predetermined distance inside from an outer edge of the working object along the outer edge. Therefore, even if a cutting stress is applied to the working object when cutting the same, thus formed reformed region or a fracture extending from the reformed region can inhibit a fracture generated in an outer edge portion of the working object from extending to the inside. As a result, the working object can be cut precisely. The "fracture" encompasses fissures, slits, crevices, and so forth.

Preferably, an end portion of the cutting start region is located outside of the reformed region in the working object. This makes it possible to apply the cutting stress to the working object uniformly when cutting the working object, thereby easily cutting the working object.

Preferably, an end portion of the cutting start region is located on or inside of the reformed region. This increases the required cutting stress and thus can prevent the working object formed with the reformed region and cutting start region from being cut unintentionally when transported before cutting, for example. That is, the handling property of the working object can be improved.

Preferably, the working object has an outer edge portion and an effective region located inside of the outer edge portion, while the reformed region is formed outside of a boundary between the outer edge portion and effective region in the working object. This can fully utilize the effective region. Here, the effective region refers to a region for forming a circuit or a functional device such as a light-receiving device, for example.

Preferably, the working object has an outer edge portion and an effective region located inside of the outer edge portion, while the reformed region is formed at a boundary between the outer edge portion and effective region or inside of the boundary in the working object. Since the outer edge portion is typically thinner than the effective region in the working object, chipping, breakage, and fractures are likely to occur in the outer edge portion during a grinding step. Therefore, forming the reformed region at the boundary between the outer edge portion and effective region or inside of the boundary in the working object can reliably inhibit fractures from extending to the inside.

A specific example of the cutting start region is a cutting reformed region formed by irradiating the working object with a laser beam while locating a converging point at the working object. Preferably, in this case, the cutting start region is kept from being exposed at front and rear faces of the working object. This can inhibit the cutting reformed region from producing dust.

Advantageous Effects of Invention

The present invention can cut the working object precisely.

BRIEF DESCRIPTION OF DRAWINGS

FIG. 10 is a plan view of a working object to which the working object cutting method in accordance with a first embodiment is applied;

FIG. 11 is a schematic sectional view taken along the line Xb-Xb of FIG. 10 for explaining the working object cutting method in accordance with the first embodiment;

FIG. 12 is a view subsequent to FIG. 11;

FIG. 13 is a view illustrating the working object after being cut;

FIG. 14 is a schematic sectional view, corresponding to FIG. 11, for explaining another example of the working object cutting method in accordance with the first embodiment;

FIG. 15 is a schematic sectional view, corresponding to FIG. 11, for explaining still another example of the working object cutting method in accordance with the first embodiment;

Figure 1:
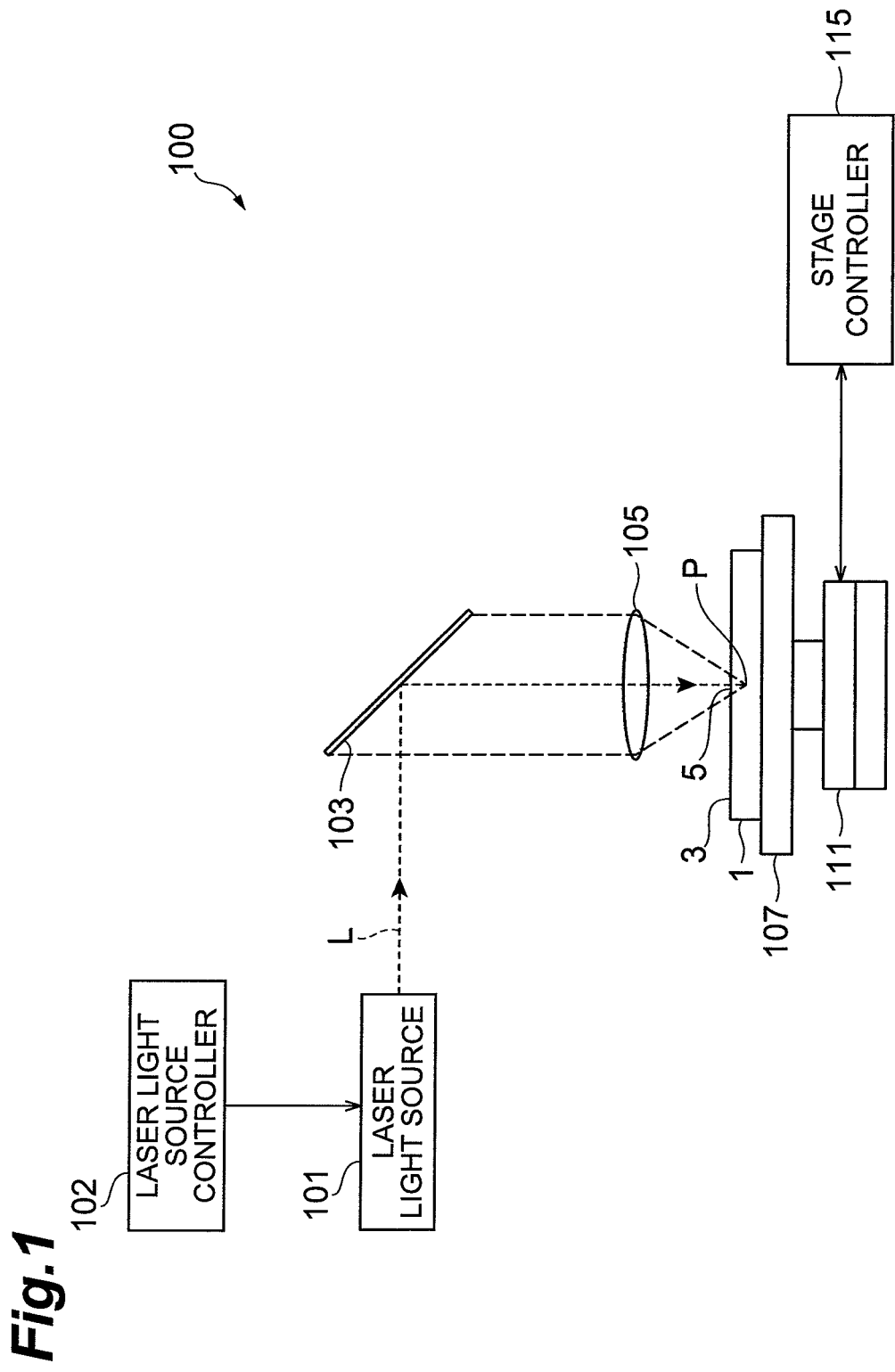
FIG. 1 is a schematic structural diagram of a laser working apparatus used for forming a reformed region.

REFERENCE SIGNS LIST 1, 1b, 1c . . . working object; 3 . . . front face; 5, 5d, 5e, 5f, 5fa, 5fb, 5g, 5ga, 5gb . . . cutting-scheduled line; 7 . . . cutting reformed region (cutting start region); 15 . . . reformed-region forming line; 17 . . . reformed region; 21 . . . rear face; 25. outer edge portion; 26 . . . effective region; 35 . . . boundary; E . . . outer edge; L . . . laser beam; P . . . converging point

DESCRIPTION OF EMBODIMENTS

In the following, preferred embodiments of the present invention will be explained in detail with reference to the drawings. In the drawings, the same or equivalent constituents will be referred to with the same signs while omitting their overlapping explanations.

The working object cutting method in accordance with an embodiment irradiates a planar working object with a laser beam while locating a converging point at the working object, so as to form a reformed region in the working object along a reformed-region forming line and a cutting-scheduled line. Therefore, with reference to a case of forming a reformed region (cutting reformed region) along the cutting-scheduled line by way of example, the reformed region will be explained at first.

As illustrated in FIG. 1, a laser working apparatus 100 comprises a laser light source 101 for pulsatingly oscillating a laser beam (processing laser beam) L and so forth, a dichroic mirror 103 arranged such as to change the direction of the optical axis of the laser beam L by 90°, and a condenser lens 105 for converging the laser bean L. The laser working apparatus 100 further comprises a support table 107 for supporting a working object 1 which is irradiated with the laser beam L converged by the condenser lens 105, a stage 111 for moving the support table 107 along X, Y, and Z axes and a θ direction about the Z axis (hereinafter simply referred to as "θ direction"), a laser light source controller 102 for regulating the laser light source 101 in order to adjust the output, pulse width, and the like of the laser beam L, and a stage controller 115 for regulating movements of the stage 111.

In the laser processing apparatus 100, the laser beam L emitted from the laser light source 101 changes the direction of its optical axis by 90° with the dichroic mirror 103, and then is converged by the condenser lens 105 into the working object 1 mounted on the support table 107. At the same time, the stage 111 is shifted, so that the working object 1 is moved relative to the laser beam L along a cutting-scheduled line 5. As a consequence, a reformed region to become a cutting start point is formed in the working object 1 along the cutting-scheduled line 5. This reformed region will be explained in detail in the following.

Figure 2:
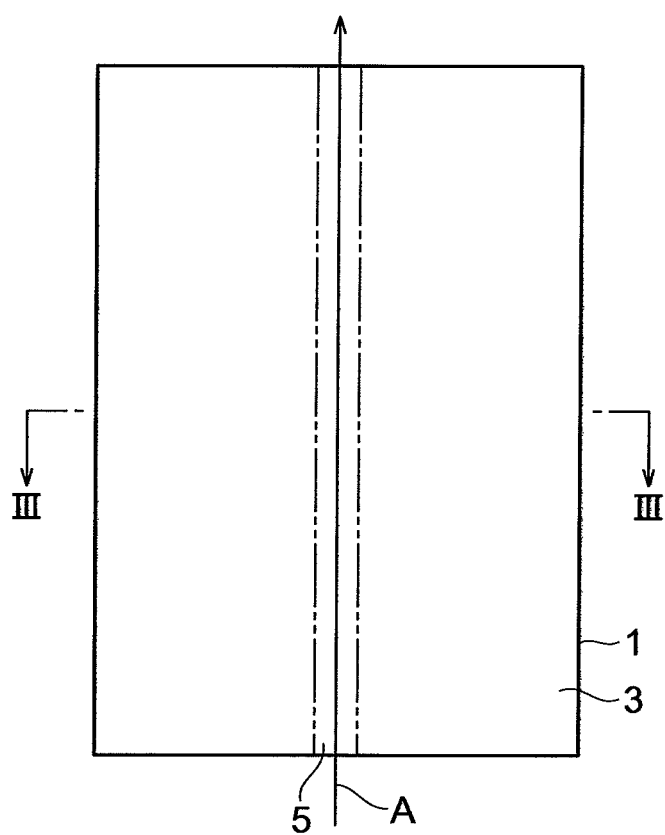
FIG. 2 is a plan view of a working object for which the reformed region is formed.
Figure 3:
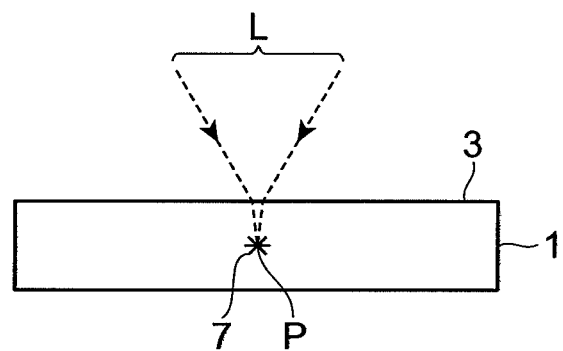
FIG. 3 is a sectional view of the working object taken along the line III-III of FIG. 2.
Figure 4:
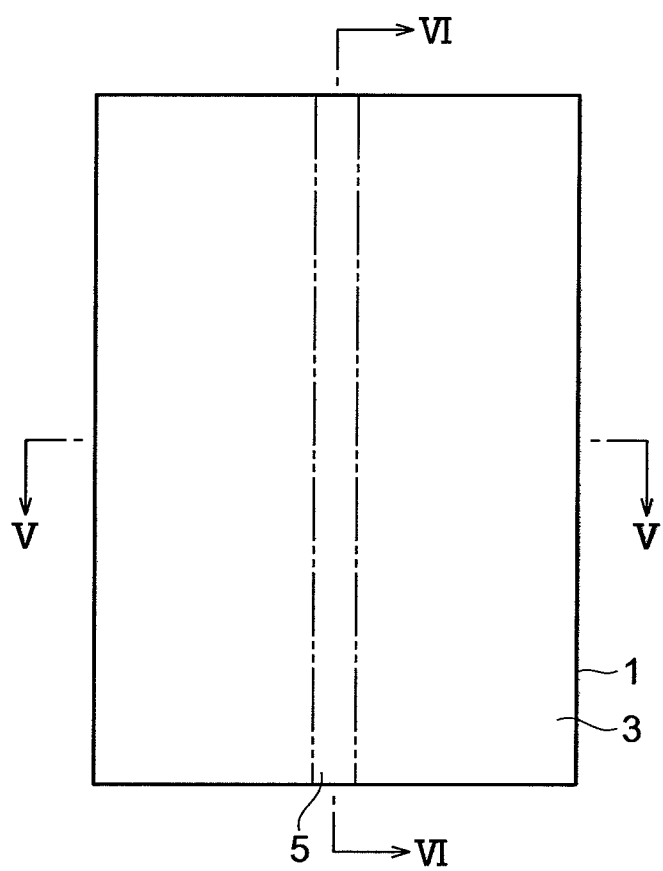
FIG. 4 is a plan view of the working object after laser working.
Figure 5:
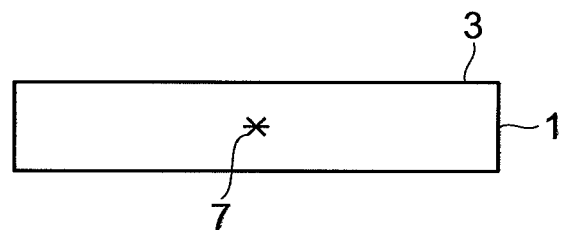
FIG. 5 is a sectional view of the working object taken along the line V-V of FIG. 4.
Figure 6:
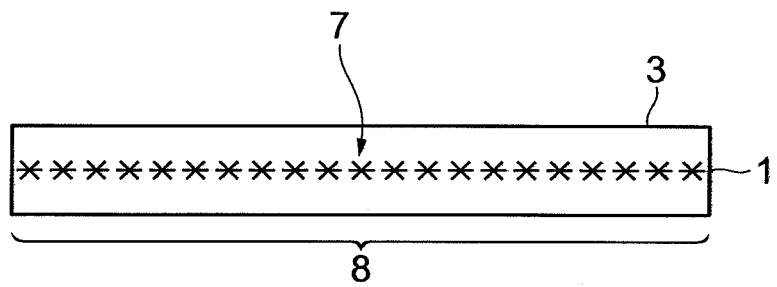
FIG. 6 is a sectional view of the working object taken along the line VI-VI of FIG. 4.

As illustrated in FIG. 2, the cutting-scheduled line 5 for cutting the planar working object 1 is set therein. The cutting-scheduled line 5 is a virtual line extending straight. When forming a reformed region within the working object 1, the laser beam L is relatively moved along the cutting-scheduled line 5 (i.e., in the direction of arrow A in FIG. 2) while locating a converging point P within the working object 1 as illustrated in FIG. 3. This forms a reformed region 7 within the working object 1 along the cutting-scheduled line 5 as illustrated in FIGS. 4 to 6, whereby the reformed region 7 formed along the cutting-scheduled line 5 becomes a cutting start region 8.

The converging point P is a position at which the laser beam L is converged. The cutting-scheduled line 5 may be curved instead of being straight, and may be a line actually drawn on the front face 3 of the working object 1 without being restricted to the virtual line. The same holds for the reformed-region forming line. The reformed region 7 may be formed either continuously or intermittently. It will be sufficient if the reformed region 7 is formed at least within the working object 1. There are cases where fissures are formed from the reformed region 7 acting as a start point, and the fissures and reformed region 7 may be exposed at outer surfaces (the front face, rear face, and outer peripheral face) of the working object 1.

Here, the laser beam L is absorbed in particular in the vicinity of the converging point within the working object 1 while being transmitted therethrough, whereby the reformed region 7 is formed in the working object 1 (i.e., internal absorption type laser working). Therefore, the front face 3 of the working object 1 hardly absorbs the laser beam L and thus does not melt. In the case of forming a removing part such as a hole or groove by melting it away from the front face 3 (i.e., surface absorption type laser working), the working region gradually progresses from the front face 3 side to the rear face side in general.

The reformed region formed in this embodiment refers to regions whose physical characteristics such as density, refractive index, and mechanical strength have attained states different from those of their surroundings. Examples of the reformed region include (1) molten processed regions, (2) crack regions or dielectric breakdown regions, (3) refractive index changed regions, and their mixed regions.

The reformed region in this embodiment can be formed by local absorption of a laser beam or a phenomenon known as multiphoton absorption. A material becomes transparent when its absorption bandgap $E_G$ is greater than photon energy hν, so that a condition under which absorption occurs in the material is $h\nu > E_G$. However, even when optically transparent, the material generates absorption under a condition of $nh\nu > E_G$ (where n=2, 3, 4, . . . ) if the intensity of laser light becomes very high. This phenomenon is known as multiphoton absorption. The forming of a molten processed region by multiphoton absorption is disclosed, for example, in "Silicon Processing Characteristic Evaluation by Picosecond Pulse Laser", Preprints of the National Meetings of Japan Welding Society, Vol. 66 (April, 2000), pp. 72-73.

Also, reformed regions formed by employing an ultrashort-pulsed laser beam having a pulse width of several picoseconds to femtoseconds may be utilized as described in D. Du, X. Liu, G. Korn, J. Squier, and G. Mourou, "Laser Induced Breakdown by Impact Ionization in $SiO_2$ with Pulse Widths from 7 ns to 150 fs", Appl. Phys. Lett. 64(23), Jun. 6, 1994.

(1) Case Where the Reformed Region Includes a Molten Processed Region

A working object (e.g., semiconductor material such as silicon) is irradiated with the laser beam L while locating a converging point within the working object under a condition with a field intensity of at least $1\times10^8$ (W/cm$^2$) at the converging point and a pulse width of 1 or less. As a consequence, the laser beam L is absorbed in the vicinity of the converging point, so that the inside of the working object is locally heated, and this heating forms a molten processed region within the working object.

The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the working object is of a silicon monocrystal structure, the molten processed region is an amorphous silicon structure, for example.

Figure 7:
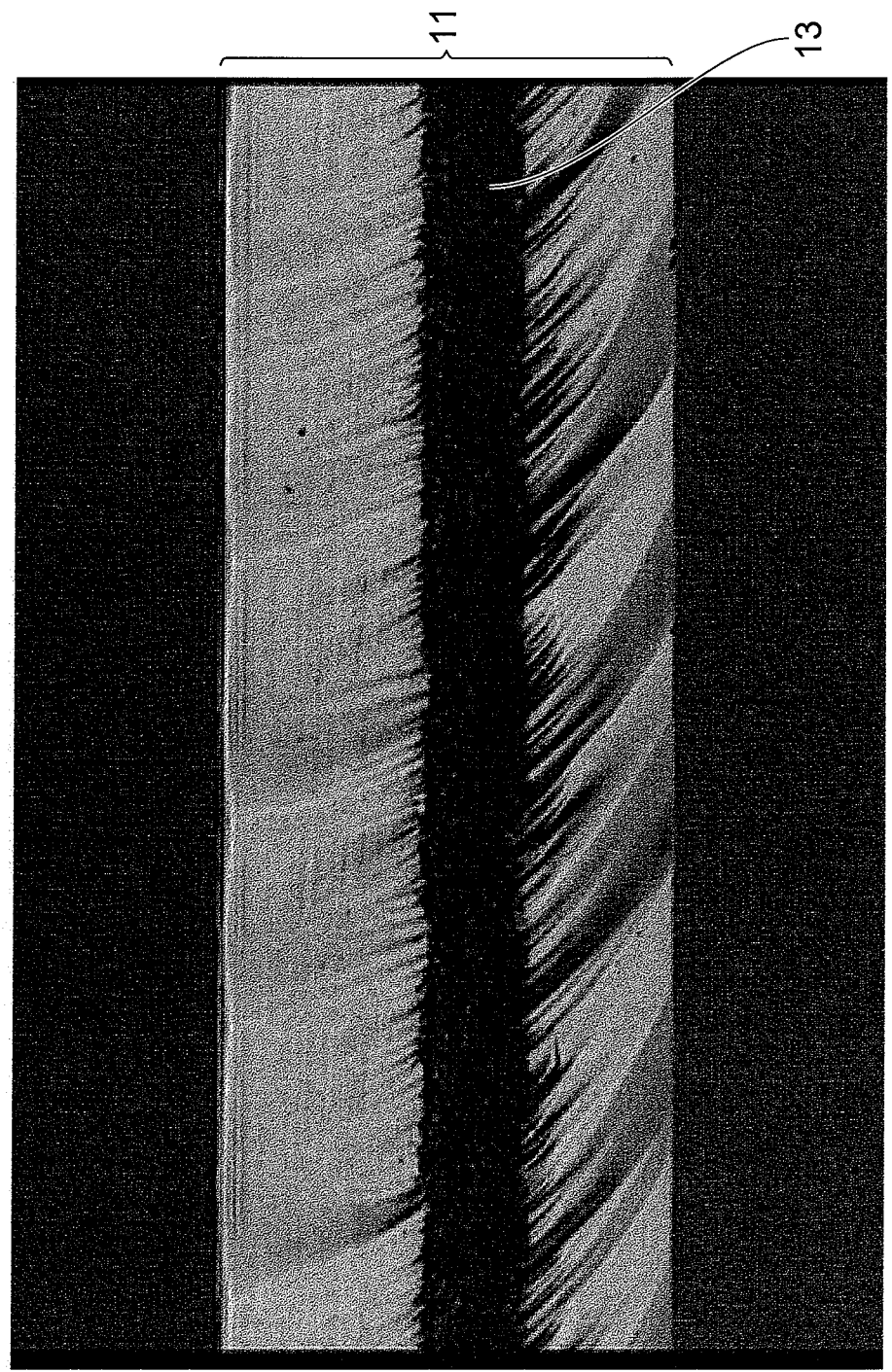
FIG. 7 is a view illustrating a photograph of a cut section of a silicon wafer after laser working.

FIG. 7 is a view illustrating a photograph of a cross section in a part of a silicon wafer (semiconductor substrate) irradiated with a laser beam. As illustrated in FIG. 7, a molten processed region 13 is formed within a semiconductor substrate 11.

Figure 8:
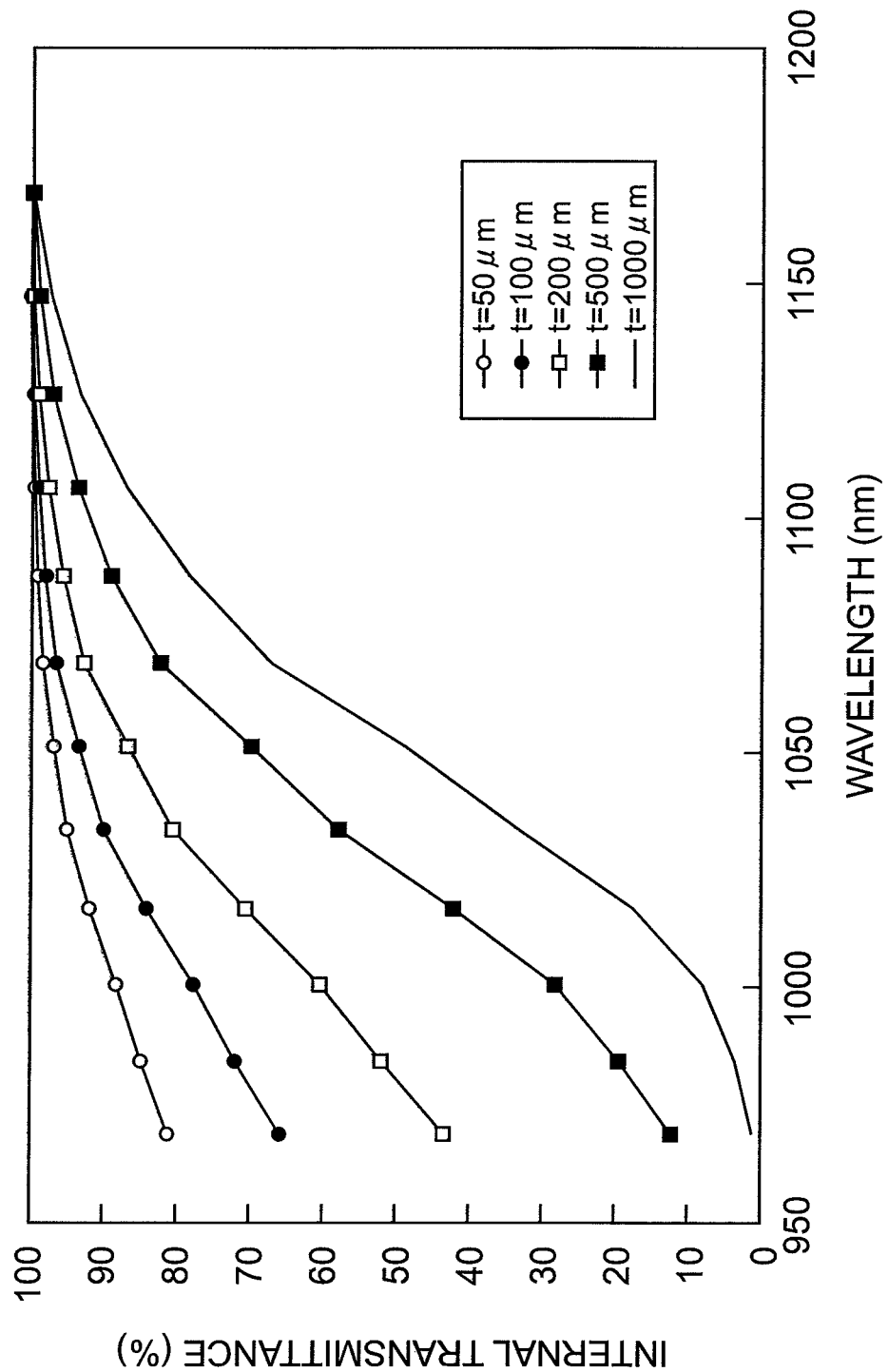
FIG. 8 is a graph illustrating relationships between the laser beam wavelength and the transmittance within a silicon substrate.

The fact that the molten processed region 13 is formed within a material transparent to the wavelength of the laser beam incident thereon will now be explained. FIG. 8 is a graph illustrating relationships between the laser beam wavelength and the transmittance within the silicon substrate. Here, the respective reflected components on the front and rear face sides of the silicon substrate are eliminated, so as to indicate the internal transmittance alone. The respective relationships are represented in the cases where the thickness t of the silicon substrate is 50 µm, 100 µm, 200 µm, 500 µm, and 1000 µm.

For example, at the Nd:YAG laser wavelength of 1064 nm, the laser beam L appears to be transmitted through the silicon substrate by at least 80% when the silicon substrate has a thickness of 500 µm or less. Since the semiconductor substrate 11 represented in FIG. 7 has a thickness of 350 µm, the molten processed region 13 is formed near the center of the semiconductor substrate 11, i.e., at a part distanced from the front face by 175 µm. The transmittance in this case is 90% or more with reference to a silicon wafer having a thickness of 200 µm, whereby the laser beam L is absorbed only slightly within the semiconductor substrate 11 but is substantially transmitted therethrough. When converged within the silicon wafer under the condition of at least $1\times10^8$ (W/cm$^2$) with a pulse width of 1 µs or less, however, the laser beam L is locally absorbed at the converging point and its vicinity, whereby the molten processed region 13 is formed within the semiconductor substrate 11.

There is a case where fissures occur in the silicon wafer from the molten processed region acting as a start point. There is also a case where fissures are formed as being incorporated in the molten processed region. In the latter case, the fissures may be formed over the whole surface of the molten processed region or in only a part or a plurality of parts thereof. These fissures may grow naturally or as a force is exerted on the silicon wafer. The fractures naturally growing from the molten processed region include both of cases where they grow from a state in which the molten processed region is molten and where they grow when the molten processed region is re-solidified from the molten state. In either case, the molten processed region is formed only within the silicon wafer and, when at a cut section, within the cut section as illustrated in FIG. 7.

(2) Case Where the Reformed Region Includes a Crack Region

A working object (e.g., glass or a piezoelectric material made of $LiTaO_3$) is irradiated with the laser beam L while locating a converging point therewithin under a condition with a field intensity of at least $1\times10^8$ (W/cm$^2$) at the converging point and a pulse width of 1 µs or less. This magnitude of pulse width is a condition under which the laser beam L is absorbed within the working object so that a crack region is formed therein. This generates a phenomenon of optical damage within the working object. This optical damage induces a thermal distortion within the working object, thereby forming a crack region including a crack or a plurality of cracks within the working object. The crack region may also be referred to as a dielectric breakdown region.

Figure 9:
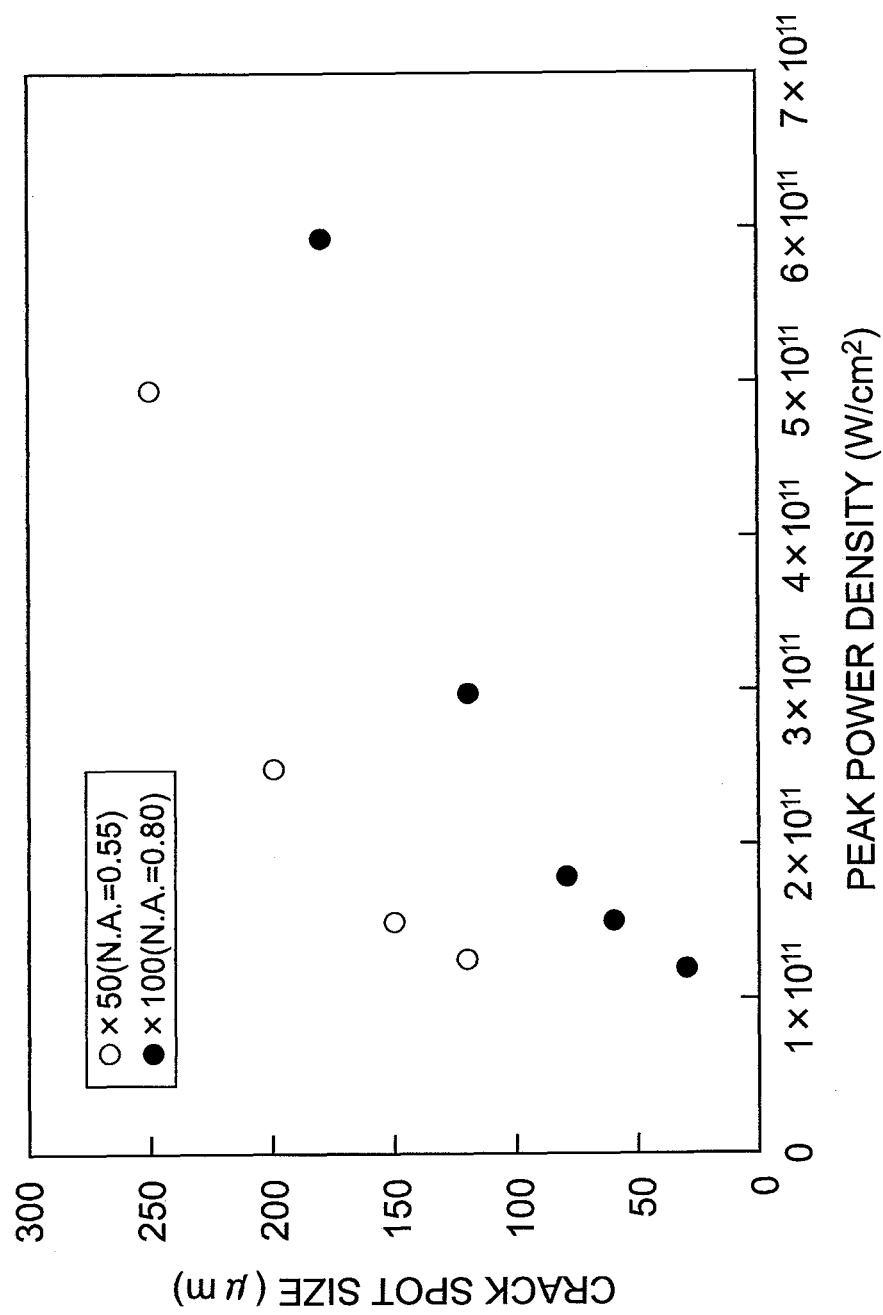
FIG. 9 is a graph illustrating relationships between the peak power density of a laser beam and crack spot size.

FIG. 9 is a graph illustrating results of experiments concerning relationships between the field intensity and crack size. The abscissa indicates the peak power density. Since the laser beam L is a pulsed laser beam, the field intensity is represented by the peak power density. The ordinate indicates the size of a crack part (crack spot) formed within the object by one pulse of the laser beam L. Crack spots gather to yield a crack region. The crack spot size is the size of a part yielding the maximum, length among forms of crack spots. Data represented by black circles in the graph refer to a case where the condenser lens (C) has a magnification of ×100 and a numerical aperture (NA) of 0.80. On the other hand, data represented by whitened circles in the graph refer to a case where the condenser lens (C) has a magnification of ×50 and a numerical aperture (NA) of 0.55. Crack spots are seen to occur within the working object from when the peak power density is about $10^{11}$ (W/cm$^2$) and become greater as the peak power density increases.

(3) Case Where the Reformed Region Includes a Refractive Index Changed Region

A working object (e.g., glass) is irradiated with the laser beam L while locating a converging point within the working object under a condition with a field intensity of at least $1\times10^8$ (W/cm$^2$) at the converging point and a pulse width of 1 ns or less. When the laser beam L is thus absorbed within the working object while having a very short pulse width, its energy is not converted into thermal energy, whereby an eternal structure change such as ion valence change, crystallization, or orientation polarization is induced within the working object, thus forming a refractive index changed region.

The reformed region, which encompasses the molten processed regions, dielectric breakdown regions, refractive index changed regions, and their mixed regions, may be an area where the density of the reformed region has changed from that of an unreformed region in the material or an area formed with a lattice defect. They can collectively be referred to as a high-density transitional region.

The molten processed regions, refractive index changed regions, areas where the reformed region has a density different from that of the unreformed region, or areas formed with a lattice defect may further incorporate a fissure (fracture or microcrack) therewithin or at an interface between the reformed and unreformed regions. The incorporated fissure may be formed over the whole surface of the reformed region or in only a part or a plurality of parts thereof.

The working object can be cut precisely if the reformed region is formed as follows while taking account of the crystal structure of the working object, its cleavage characteristic, and the like.

That is, in the case of a substrate made of a monocrystal semiconductor having a diamond structure such as silicon, it will be preferred if the reformed region is formed in a direction extending along a (111) plane (first cleavage plane) or a (110) plane (second cleavage plane). In the case of a substrate made of a group III-V compound semiconductor of sphalerite structure such as GaAs, it will be preferred if the reformed region is formed in a direction extending along a (110) plane. In the case of a substrate having a crystal structure of hexagonal system such as sapphire ($Al_2O_3$), it will be preferred if the reformed region is formed in a direction extending along a (1120) plane (A plane) or a (1100) plane (M plane) while using a (0001) plane (C plane) as a principal plane.

When the substrate is formed with an orientation flat in a direction to be formed with the above-mentioned reformed region (e.g., a direction extending along a (111) plane in a monocrystal silicon substrate) or a direction orthogonal to the direction to be formed therewith, the reformed region can be formed easily and accurately in the substrate with reference to the orientation flat.

The working object cutting method in accordance with the first embodiment of the present invention will now be explained.

The working object cutting method in accordance with this embodiment cuts a very thin semiconductor substrate having a thickness of 15 to 25 μm, for example, so as to form very thin semiconductor chips. FIG. 10(*a*) is a plan view of a working object to which the working object cutting method in accordance with the first embodiment is applied, while FIG. 10(*b*) is a sectional view taken along the line Xb-Xb of FIG. 10(*a*). As illustrated in FIG. 10, the working object 1 to which this embodiment is applied is shaped like a disc made of silicon. Here, a cylindrical silicon ingot is cut into round slices, and the rear face of each slice is ground so as to become thinner, thereby forming the working object 1. For convenience of explanation, the orientation flat is omitted in the working object 1.

The working object 1 has an outer edge portion 25 and an effective region 26 located inside of the outer edge portion 25. The outer edge portion 25 is a portion constructed such as to include a side face projecting as a curved surface in the working object 1. The outer edge portion 25 has a semiarcuate cross section in a side view, so that its thickness tapers down toward the outer edge. The effective region 26 is a region for forming a circuit or a functional device such as a light-receiving device. The outer edge portion 25 may linearly taper down its thickness toward the outer edge.

A plurality of functional devices 22 are formed on the effective region 26 of the front face 3 of the working object 1. A number of functional devices 22, examples of which include semiconductor operating layers formed by crystal growth, light-receiving devices such as photodiodes, light-emitting devices such as laser diodes, and circuit devices formed as circuits, are formed like a matrix of one direction and the other direction perpendicular thereto.

In the working object 1, a reformed-region forming line 15 for forming a reformed region 17 (see FIG. 11(*b*)) is set at a predetermined distance inside from its outer edge E. The reformed-region forming line 15 has an annular form extending along the outer edge E of the working object 1 and is set outside of a boundary 35 between the outer edge portion 25 and the effective region 26 in the working object 1.

In the working object 1, a plurality of cutting-scheduled lines 5 are set like grids so as to pass between the functional devices adjacent to each other. End portions 36 of the cutting-scheduled lines 5 are located outside of the reformed-region forming line 15 in the working object 1. In other words, the cutting-scheduled lines 5 intersect the reformed-region forming line 15 so as to pass therethrough.

When cutting the working object 1 explained in the foregoing, as illustrated in FIG. 11(*a*), a tape 31 is attached to the rear face 21 of the working object 1 at first, and the latter is mounted on a stage (not depicted). In this state, as illustrated in FIG. 11(*b*), the stage is rotated in the θ direction (the direction of depicted arrow R) relative to the laser beam L while the working object 1 is irradiated with the laser beam L from the front face 3 side with a converging point located at the working object 1. This forms the reformed region 17 within the working object 1 along the reformed-region forming line 15 at the outer peripheral edge as illustrated in FIG. 11(*c*) and causes fissures (fractures) C to extend thickwise from the upper and lower end portions of the reformed region 17. Though not essential, the fissures C make it easier to apply a stress to the working object 1 when expanding the tape 31 and cut the working object 1 and the outer edge portion 25.

Subsequently, as illustrated in FIG. 12(*a*), the stage is moved along the cutting-scheduled line 5 relative to the laser beam L while irradiating the working object 1 with the laser beam L from the front face 3 side thereof with a converging point located at the working object 1. This forms the cutting reformed region 7 as a cutting start region to become a cutting start point along the cutting-scheduled line 5 in the working object 1 as illustrated in FIG. 12(*b*). The cutting reformed region 7 reaches the side face of the working object 1 but falls short of being exposed at the front face 3 and rear face 21. The reformed regions 7, 17 may include fissures therewithin.

Then, as illustrated in FIG. 12(*c*), the tape 31 is expanded, so as to apply a tensile cutting stress to the working object 1, thereby cutting (severing) the working object 1 along the cutting-scheduled line 5 from the cutting reformed region 7 acting as a start point. Here, the working object 1 is severed along the reformed-region forming line 15 from the reformed region 17 acting as a start point at the time of expanding the tape 31 or naturally.

When cutting the working object 1, fissures 28 generated in the outer edge portion 25 of the working object 1 may extend to the inside under a cutting stress. In this regard, the reformed region 17 is formed along the reformed-region forming line 15 set at a predetermined distance inside from the outer edge E of the working object 1 in this embodiment as mentioned above. Therefore, even if a cutting stress is applied to the working object 1 when cutting the latter, the reformed region 17 or the fissures C extending therefrom can inhibit the fissures 28 generated in the outer edge portion 25 from extending to the inside. Hence, this embodiment can cut the working object 1 precisely. This effect becomes remarkable in this embodiment in which chipping (breakage) is likely to occur in the outer edge portion 25 in particular since the working object 1 is very thin.

FIG. 13(*a*) is a plan view illustrating the working object after being cut by the working object cutting method of this embodiment, while FIG. 13(*b*) is an enlarged cross-sectional view taken along the line XIIIb-XIIIb of FIG. 13(a). As illustrated in FIG. 13(b), a chipping 27 is generated in the outer edge portion 25 of the working object 1. Also, the fissures 28 extend from the chipping 27 and the outer edge portion 25. Here, the fissures 28 are seen to stop extending to the inside of a cut portion 17a cut by the reformed region 17 and fissures C. That is, the reformed region 17 and fissures C serve as a guard which functions as a stopper for keeping the fissures 28 from extending to the inside, thereby keeping the fissures 28 from extending from the outer edge portion 25 to the effective region 26. As illustrated in FIG. 13(a), when viewed from the front face 3, the fissures 28 are seen to be easier to extend in the circumferential direction along which the cutting portion 17a extends. That is, the reformed region 17 and fissures C positively extend the fissures 28 in the circumferential direction.

In this embodiment, as mentioned above, the end portions 36 of the cutting-scheduled lines 5 are located outside of the reformed-region forming line 15, whereby the end portions of the cutting reformed regions 7 are located outside of the reformed region 17. This makes it easier to apply a cutting stress uniformly to the working object 1 when cutting the latter, whereby the working object 1 can be cut easily.

In this embodiment, as mentioned above, the reformed region forming line 15 is set outside of the boundary between the outer edge portion 25 and the effective region 26, whereby the reformed region 17 is formed outside of the boundary between the outer edge portion 25 and the effective region 26. This makes it possible to fully utilize the effective region 26.

Since the cutting reformed region 7 is kept from being exposed at the front face 3 and rear face 21 of the working object 1 as mentioned above, this embodiment can inhibit the cutting reformed region 7 from producing dust.

Though the cutting reformed regions 7 are formed such as to reach the side face of the working object 1 whose outer edge portion 25 has a semiarcuate cross section in this embodiment, this is not restrictive. For example, as illustrated in FIG. 14(a), the cutting reformed regions 7 may be formed such as to reach the side face of a working object 1b whose outer edge portion 25 has a rectangular cross section. Here, corner parts of the outer edge portion 25 may be tapered as if chamfered. As illustrated in FIG. 14(b), the cutting reformed regions 7 may be formed such as to reach the side face of a working object 1c whose outer edge portion 25 has an arcuate cross section. As illustrated in FIG. 15(a), the cutting reformed regions 7 may be formed such as to fall short of the side face of the working object 1 instead of reaching the same. The cutting reformed regions 7 may be formed such as to fall short of reaching the side face of the working object 1b as illustrated in FIG. 15(b) or the side face of the working object 1c as illustrated in FIG. 15(c). The working object 1 may be irradiated with the laser beam L from the rear face 21 side instead of the front face 3 side. The same holds for the following embodiments as well.

The working object cutting method in accordance with the second embodiment of the present invention will now be explained.

Figure 16:
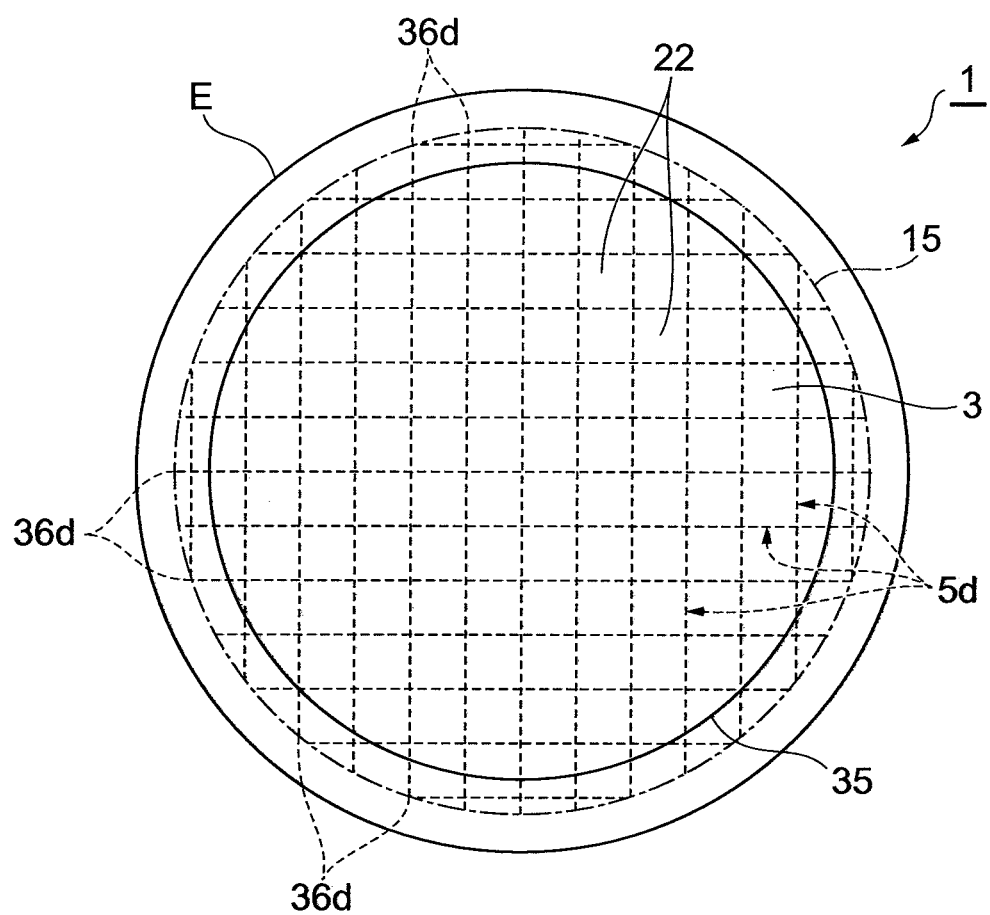
FIG. 16 is a plan view of a working object to which the working object cutting method in accordance with a second embodiment is applied.

The working object cutting method in accordance with this embodiment differs from that of the first embodiment in that a plurality of cutting-scheduled lines 5d are set in the working object 1 as illustrated in FIG. 16 instead of the plurality of cutting-scheduled lines 5 (see FIG. 10). End portions 36d of the cutting-scheduled lines 5d are located on a reformed-region forming line in the working object 1. In other words, the cutting-scheduled lines 5d intersect the reformed-region forming line 15 without passing therethrough.

This embodiment has the same effect as that mentioned above, i.e., the effect of cutting the working object 1 precisely.

In this embodiment, as mentioned above, the end portions 36d of the cutting-scheduled lines 5d are located on the reformed-region forming line 15, whereby the end portions of the cutting reformed regions 7 are placed on the reformed region 17. This increases the required cutting stress and thus can prevent the working object 1 formed with the reformed region 17 and cutting reformed regions 7 from being cut unintentionally when transported before cutting, for example. Therefore, the cut working objects 1 can be prevented from coming into contact with each other and chipping, while the handling property of the working object 1 can be improved.

The working object cutting method in accordance with the third embodiment of the present invention will now be explained.

Figure 17:
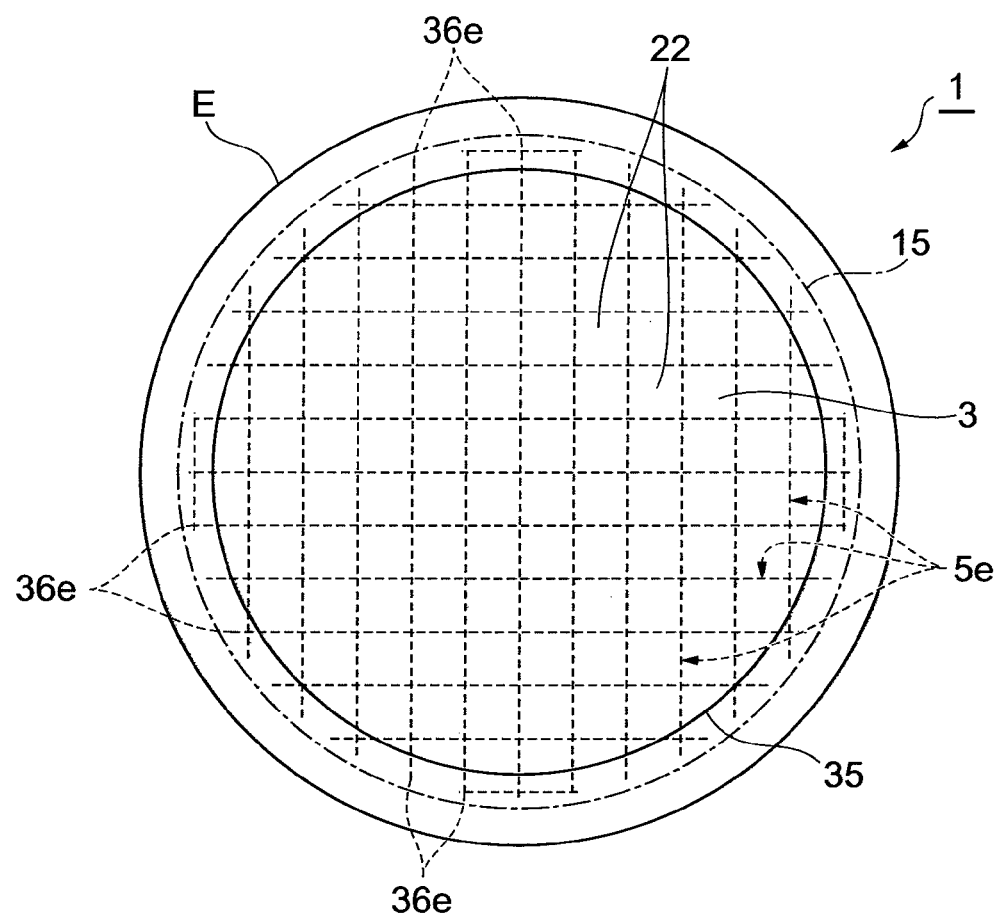
FIG. 17 is a plan view of a working object to which the working object cutting method in accordance with a third embodiment is applied.

The working object cutting method in accordance with this embodiment differs from that of the first embodiment in that a plurality of cutting-scheduled lines 5e are set in the working object 1 as illustrated in FIG. 17 instead of the plurality of cutting-scheduled lines 5 (see FIG. 10). End portions 36e of the cutting-scheduled lines 5e are located inside of the reformed-region forming line 15 in the working object 1. In other words, the cutting-scheduled lines 5e are set such as not to intersect the reformed-region forming line 15.

This embodiment also has the same effect as that mentioned above, i.e., the effect of cutting the working object 1 precisely.

In this embodiment, as mentioned above, the end portions 36e of the cutting-scheduled lines 5e are located inside of the reformed-region forming line 15, whereby the end portions of the cutting reformed regions 7 are placed inside of the reformed region 17. This increases the required cutting stress and thus can prevent the working object 1 from being cut unintentionally as in the above-mentioned second embodiment. Therefore, the cut working objects 1 can be prevented from coming into contact with each other and chipping, while the handling property of the working object 1 can be improved.

The working object cutting method in accordance with the fourth embodiment of the present invention will now be explained.

Figure 18:
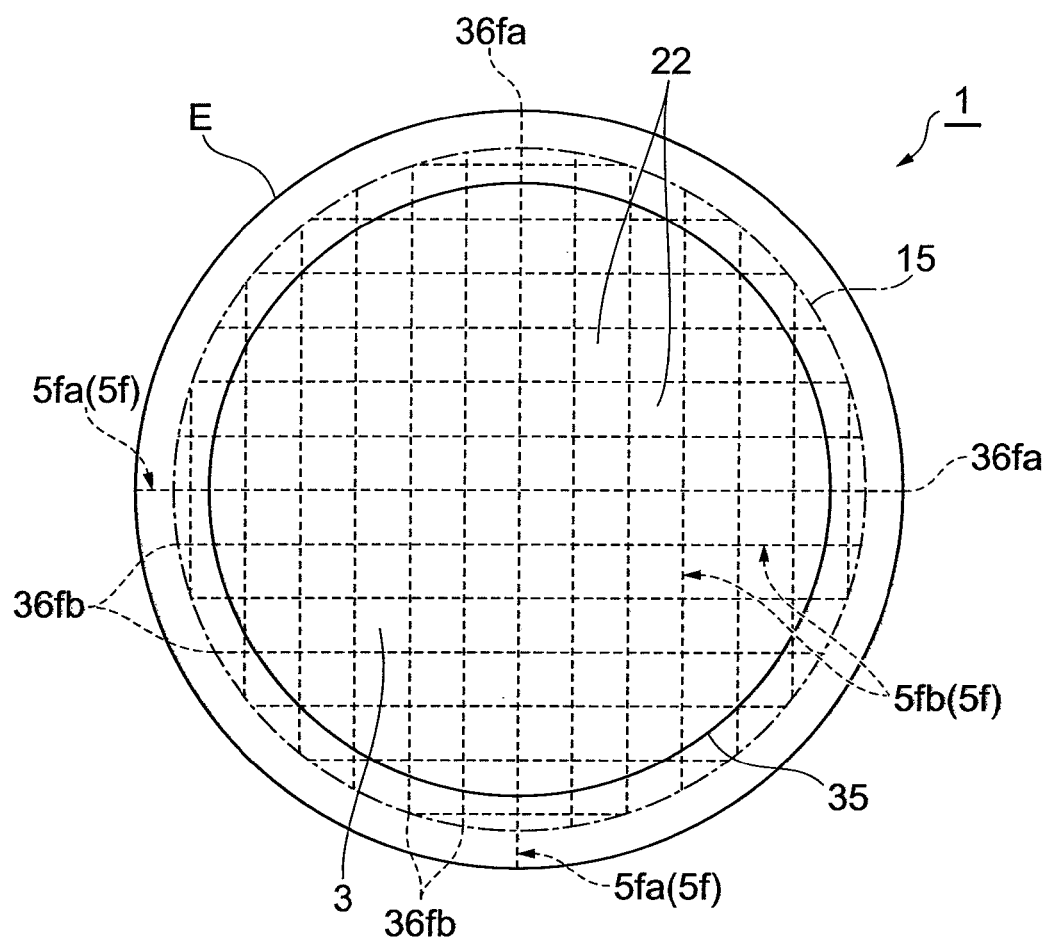
FIG. 18 is a plan view of a working object to which the working object cutting method in accordance with a fourth embodiment is applied.

The working object cutting method in accordance with this embodiment differs from that of the first embodiment in that a plurality of cutting-scheduled lines 5f are set in the working object 1 as illustrated in FIG. 18 instead of the plurality of cutting-scheduled lines 5 (see FIG. 10). End portions 36fa of cutting-scheduled lines 5fa in a part of the cutting-scheduled lines 5f are located outside of the reformed-region forming line 15 in the working object 1. These cutting-scheduled lines 5fa extend such as to divide the reformed-region forming line 15 equally (into four parts here) as seen from the front face 3 of the working object 1. On the other hand, end portions 36fb of the remaining cutting-scheduled lines 5fb in the cutting-scheduled lines 5f are located on the reformed region forming line 15 in the working object 1.

This embodiment also has the same effect as that mentioned above, i.e., the effect of cutting the working object 1 precisely.

In this embodiment, as mentioned above, the end portions 36fa of the cutting-scheduled lines 5fa are located outside of the reformed-region forming line 15, whereby the end portions of the cutting reformed regions 7 extending along the cutting-scheduled lines 5fa are placed outside of the reformed region 17. This makes it easier to apply a cutting stress uniformly to the working object 1 when cutting the latter, whereby the working object can be cut easily.

On the other hand, the end portions 36*fb* of the cutting-scheduled lines 5*fb* are located on the reformed-region forming line 15, whereby the end portions of the cutting reformed regions 7 extending along the cutting-scheduled lines 5*fb* are placed on the reformed region 17. This increases the required cutting stress and thus can prevent the working object 1 from being cut unintentionally, whereby the cut working objects 1 can be prevented from coming into contact with each other and chipping, while the handling property of the working object 1 can be improved.

The working object cutting method in accordance with the fifth embodiment of the present invention will now be explained.

Figure 19:
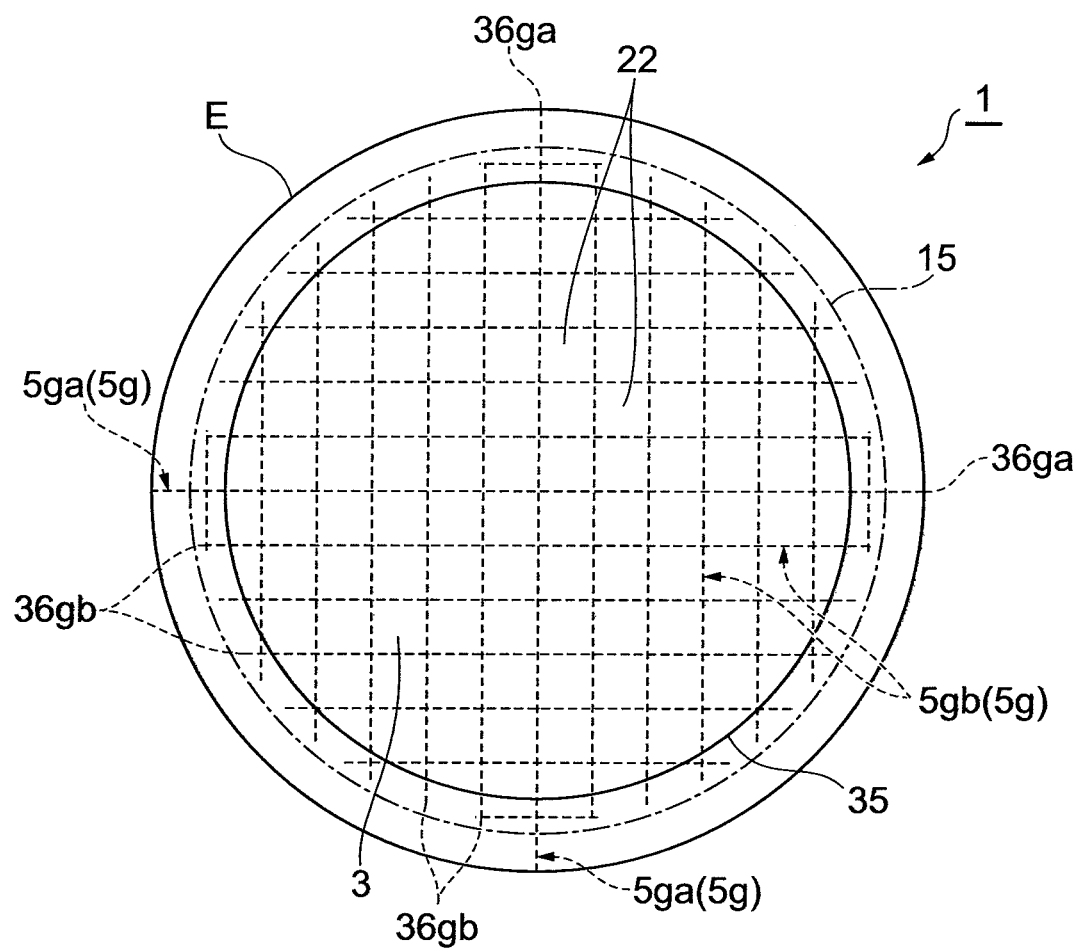
FIG. 19 is a plan view of a working object to which the working object cutting method in accordance with a fifth embodiment is applied.

The working object cutting method in accordance with this embodiment differs from that of the first embodiment in that a plurality of cutting-scheduled lines 5*g* are set in the working object 1 as illustrated in FIG. 19 instead of the plurality of cutting-scheduled lines 5 (see FIG. 10).

End portions 36*ga* of cutting-scheduled lines 5*ga* in a part of the cutting-scheduled lines 5*g* are located outside of the reformed-region forming line 15 in the working object 1. These cutting-scheduled lines 5*ga* extend such as to divide the reformed-region forming line 15 equally (into four parts here) as seen from the front face 3 of the working object 1. On the other hand, end portions 36*gb* of the remaining cutting-scheduled lines 5*gb* in the cutting-scheduled lines 5*g* are located inside of the reformed region forming line 15 in the working object 1.

This embodiment also has the same effect as that mentioned above, i.e., the effect of cutting the working object 1 precisely.

In this embodiment, as mentioned above, the end portions 36*ga* of the cutting-scheduled lines 5*ga* are located outside of the reformed-region forming line 15, whereby the end portions of the cutting reformed regions 7 extending along the cutting-scheduled lines 5*ga* are placed outside of the reformed region 17. This makes it easier to apply a cutting stress uniformly to the working object 1 when cutting the latter, whereby the working object 1 can be cut easily.

On the other hand, the end portions 36*gb* of the cutting-scheduled lines 5*gb* are located inside of the reformed-region forming line 15, whereby the end portions of the cutting reformed regions 7 extending along the cutting-scheduled lines 5*gb* are placed inside of the reformed region 17. This increases the required cutting stress and thus can prevent the working object 1 from being cut unintentionally, whereby the cut working objects 1 can be prevented from coming into contact with each other and chipping, while the handling property of the working object 1 can be improved.

The present invention is not limited to the above-mentioned embodiments. For example, the reformed region 17 is formed outside of the boundary 35 between the outer edge portion 25 and the effective region 26 in the working object 1 in the above-mentioned embodiments, but may be formed on or inside of the boundary 35. Here, the outer edge portion 25 is thinner than the effective region 26 and thus is likely to generate fissures. Therefore, forming the reformed region 17 on or inside of the boundary 35 as mentioned above can reliably inhibit the fissures 28 generated in the outer edge portion 25 from extending to the inside.

The cutting reformed regions 7 are formed after forming the reformed region 17 in the above-mentioned embodiments, but may be formed thereafter. The reformed region 17 is formed in the working object 1 formed with the functional devices 22, but the functional devices 22 may be formed after forming the reformed regions 7. The reformed region 17 may be formed before thinning the working object 1.

The cutting reformed regions 7 are formed as a cutting start region in the above-mentioned embodiments, but may be a groove or the like formed by laser abrasion, scribing, blade dicing, or the like. The cutting reformed region 7 in the above-mentioned embodiments is kept from being exposed at the front face 3 and rear face 21 of the working object 1, but may be exposed at one or both of them.

Though the reformed regions 7 including a molten processed region are formed in the working object 1 made of a semiconductor material, other reformed regions such as crack regions and refractive index changed regions may be formed within working objects made of other materials such as glass and piezoelectric materials. The fissures in the above-mentioned embodiments may be fractures such as slits and crevices.

INDUSTRIAL APPLICABILITY

The present invention can cut the working object precisely.

The invention claimed is:

1. A working object cutting method for cutting a planar working object along a plurality of cutting-scheduled lines, the method comprising the steps of:
   irradiating the working object with a laser beam while locating a converging point within the working object, so as to form a reformed region in the working object along a reformed-region forming line set at a predetermined distance inside from an outer edge of the working object along the outer edge;
   forming a cutting start region along the cutting-scheduled lines; and
   cutting the working object along the cutting-scheduled lines from the cutting start region acting as a start point, wherein
   the working object is shaped like a disc,
   the reformed-region forming line has an annular form extending along the outer edge of the working object and the reformed region is generated by relatively and annularly moving the laser beam with respect to the working object while irradiating the working object to generate the reformed region within the object, and
   the cutting-scheduled lines are set like grids located inside of the reformed-region forming line.

2. A working object cutting method according to claim 1, wherein an end portion of the cutting start region is located outside of the reformed region in the working object.

3. A working object cutting method according to claim 1, wherein an end portion of the cutting start region is located on or inside of the reformed region.

4. A working object cutting method according to claim 1, wherein the working object has an outer edge portion and an effective region located inside of the outer edge portion; and
   wherein the reformed region is formed outside of a boundary between the outer edge portion and effective region in the working object.

5. A working object cutting method according to claim 2, wherein the working object has an outer edge portion and an effective region located inside of the outer edge portion; and
   wherein the reformed region is formed outside of a boundary between the outer edge portion and effective region in the working object.

6. A working object cutting method according to claim 3, wherein the working object has an outer edge portion and an effective, region located inside of the outer edge portion; and
   wherein the reformed region is formed outside of a boundary between the outer edge portion and effective region in the working object.

7. A working object cutting method according to claim 1, wherein the working object has an outer edge portion and an effective region located inside of the outer edge portion; and
   wherein the reformed region is formed on or inside of a boundary between the outer edge portion and effective region in the working object.

8. A working object cutting method according to claim 2, wherein the working object has an outer edge portion and an effective region located inside of the outer edge portion; and
   wherein the reformed region is formed on or inside of a boundary between the outer edge portion and effective region in the working object.

9. A working object cutting method according to claim 3, wherein the working object has an outer edge portion and an effective region located inside of the outer edge portion; and
   wherein the reformed region is formed on or inside of a boundary between the outer edge portion and effective region in the working object.

10. A working object cutting method according to claim 1, wherein the cutting start region is a cutting reformed region formed by irradiating the working object with a laser beam while locating a converging point at the working object.

11. A working object cutting method according to claim 1, wherein the cutting start region is kept from being exposed at front and rear faces of the working object.

* * * * *